(12) United States Patent
Abdennadher

(10) Patent No.: US 7,088,091 B2
(45) Date of Patent: Aug. 8, 2006

(54) TESTING A MULTI-CHANNEL DEVICE

(75) Inventor: Salem Abdennadher, Sacramento, CA (US)

(73) Assignee: Intel Corporation, Santa Clrara, CA (US)

( * ) Notice: Subject to any disclaimer, the term of this patent is extended or adjusted under 35 U.S.C. 154(b) by 0 days.

(21) Appl. No.: 10/640,913

(22) Filed: Aug. 14, 2003

(65) Prior Publication Data
US 2005/0035753 A1 Feb. 17, 2005

(51) Int. Cl.
G01R 31/28 (2006.01)

(52) U.S. Cl. .................................................. 324/158.1

(58) Field of Classification Search ............. 324/158.1, 324/763, 765; 714/724–725, 727, 731, 733; 326/126–127; 347/237, 240
See application file for complete search history.

(56) References Cited

U.S. PATENT DOCUMENTS

| | | | | |
|---|---|---|---|---|
| 5,254,940 A | * | 10/1993 | Oke et al. ..................... 714/733 |
| 5,379,302 A | * | 1/1995 | Andrews ................... 324/158.1 |
| 5,396,170 A | * | 3/1995 | D'Souza et al. .......... 324/158.1 |
| 5,428,624 A | * | 6/1995 | Blair et al. ............... 324/158.1 |
| 5,434,804 A | | 7/1995 | Bock et al. ................. 364/579 |
| 5,477,545 A | * | 12/1995 | Huang ..................... 324/158.1 |
| 5,736,849 A | * | 4/1998 | Terayama ................. 324/158.1 |
| 5,768,289 A | * | 6/1998 | James ......................... 714/727 |
| 5,793,778 A | * | 8/1998 | Qureshi ...................... 714/727 |
| 5,859,657 A | * | 1/1999 | Donahue et al. ............ 347/237 |
| 5,892,778 A | * | 4/1999 | Golshan et al. .......... 324/158.1 |
| 5,974,578 A | * | 10/1999 | Mizokawa et al. ......... 714/727 |
| 6,052,811 A | | 4/2000 | Ahsuri ....................... 714/745 |
| 6,058,255 A | * | 5/2000 | Jordan ........................... 716/4 |
| 6,266,793 B1 | | 7/2001 | Mozdzen et al. ........... 714/727 |
| 6,320,527 B1 | * | 11/2001 | Dedic et al. ................. 341/144 |
| 6,453,445 B1 | * | 9/2002 | Kuhn et al. .................... 716/3 |
| 6,519,728 B1 | * | 2/2003 | Tsujii et al. ................. 324/765 |
| 6,586,921 B1 | * | 7/2003 | Sunter ....................... 324/158.1 |
| 6,720,812 B1 | * | 4/2004 | Tumer et al. ................ 327/170 |
| 6,788,095 B1 | * | 9/2004 | Mark et al. ............... 324/158.1 |

OTHER PUBLICATIONS

Intel Application Note, AP-630 "Designing for On-Board Programming Using the IEEE 1149.1 (JTAG) Access Port", Nov. 1996.
Intel Product Preview Datasheet, "21554 PCI-to-PCI Bridge for Embedded Applications", Dec. 1998.

* cited by examiner

Primary Examiner—Jermele Hollington
(74) Attorney, Agent, or Firm—Trop, Pruner & Hu, P.C.

(57) ABSTRACT

In one embodiment, a method includes routing first test data from a first channel of a device to a second channel of the device, and outputting the first test data from the second channel. The device, in one embodiment, may be a mixed signal device and the test data may be alternating current test data.

18 Claims, 4 Drawing Sheets

TESTING A MULTI-CHANNEL DEVICE

BACKGROUND

The present invention relates to testing semiconductor devices, and more particularly to testing of high speed multi-channel devices.

Testing high speed multi-channel semiconductor devices at wafer sort, such as mixed signal devices (i.e., a device including both analog and digital components) at speed presents a challenge as there are a limited number of radio frequency (RF) probes that can be used on such devices. During manufacture of such devices, process variations can have a significant impact on component parameter values of the devices, and multiple minor variations in several components of the device are as significant as large variations. In fact, multiple minor variations in several components may cause a device to fail to meet specifications. Thus at speed testing of all channels of such devices is becoming a necessity.

While different approaches are available to test such devices, limitations exist. One approach is to test only one or two channels of a multi-channel device by verifying direct current (DC) and alternating current (AC) specifications, while verifying only the DC specifications of remaining channels. However, such testing may cause failures to remain undetected. Testing both AC and DC specifications of every channel is risky and very expensive, particularly as a limitation on the number of RF probes exists.

Thus a need exists to more efficiently test analog and mixed signal devices.

DETAILED DESCRIPTION

Figure 1:
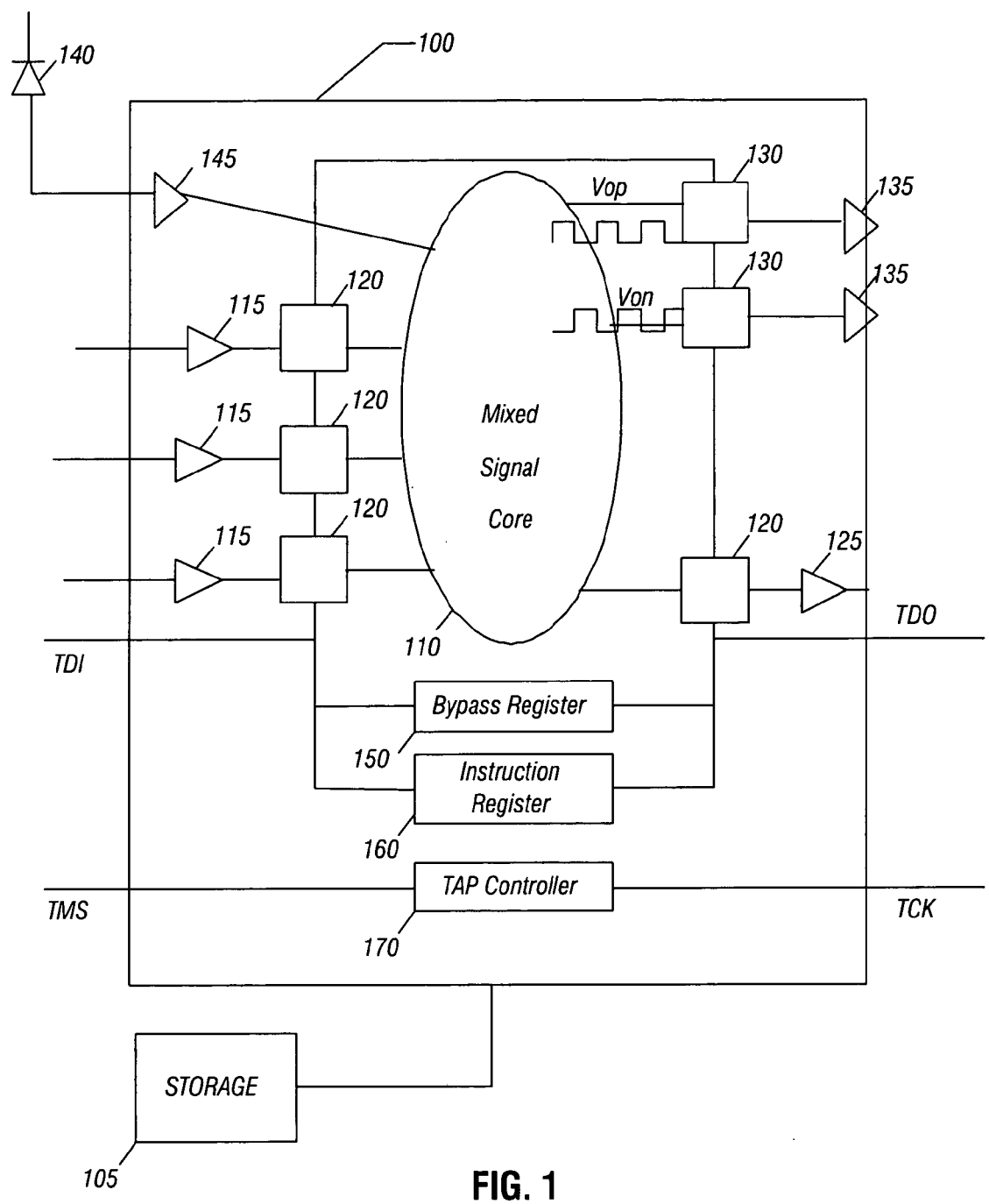
FIG. 1 is a block diagram of a device in accordance with one embodiment of the present invention.

Referring to FIG. 1, shown is a block diagram of a semiconductor device in accordance with one embodiment of the present invention. As shown in FIG. 1, semiconductor device 100 is a mixed signal device having a mixed signal core 110. While the nature and purpose of semiconductor device 100 may vary in different embodiments, in one embodiment semiconductor device 100 may be a physical media dependent (PMD) device. Alternately, semiconductor device 100 may be a physical media access (PMA) device, for example.

As shown in FIG. 1, a plurality of DC inputs may be provided to DC input drivers 115, each of which may be coupled to a DC boundary-scan cell (otherwise referred to as a boundary cell or a "DC BC") 120. Such boundary-scan cells may be in accordance with the Institute of Electrical and Electronics Engineers 1149.1-2001 std, (published 2001), otherwise known as the Joint Test Action Group (JTAG) standard. Each of the DC boundary cells 120 may be coupled to a portion of mixed signal core 110. One output of mixed signal core 110 is shown coupled to a representative DC boundary cell 120, which is connected to a DC output driver 125.

Also shown in FIG. 1 is a photodiode 140 which is coupled to a RF input driver 145, which in turn is coupled to mixed signal core 110. Analog outputs of mixed signal core 110 may be coupled to AC boundary-scan cells 130, which in turn may be coupled to RF output drivers 135. In one embodiment, AC boundary-scan cells 130 may be in accordance with the IEEE 1149.6 std (published 2003). While two representative AC boundary cells are shown in FIG. 1, it is to be understood that in other embodiments additional cells (both AC and DC) may be present.

Referring still to FIG. 1, semiconductor device 100 also includes various components in accordance with a JTAG-compliant device. Specifically, test data in accordance with the JTAG standard may be input into device 100 via a test data in (TDI) line. As shown, the TDI line is coupled to boundary-scan cells 120 and 130, in addition to certain JTAG registers. These JTAG registers may include a bypass register 150, which is used to bypass JTAG test logic via a serial connection through the device from the TDI line to a test data out (TDO) line. An instruction register 160 is also coupled to the JTAG test logic. Instruction register 160 may be used to select the test mode and features of operation of the boundary-scan cells. Finally, a test access port (TAP) controller 170 may be coupled to receive a test mode select (TMS) signal and a boundary-scan clock (TCK) signal. TAP controller 170 may be a state machine used to interpret JTAG protocols received via the TMS signal line. TAP controller 170 may provide control signals (not shown in FIG. 1) to enable desired operation of the boundary cells.

As shown in FIG. 1, each boundary-scan cell 120 and 130 may be coupled to a respective input or output pin of device 100, except for pins receiving optical or other such signals (i.e., optical information from photodiode 140).

Figure 2:
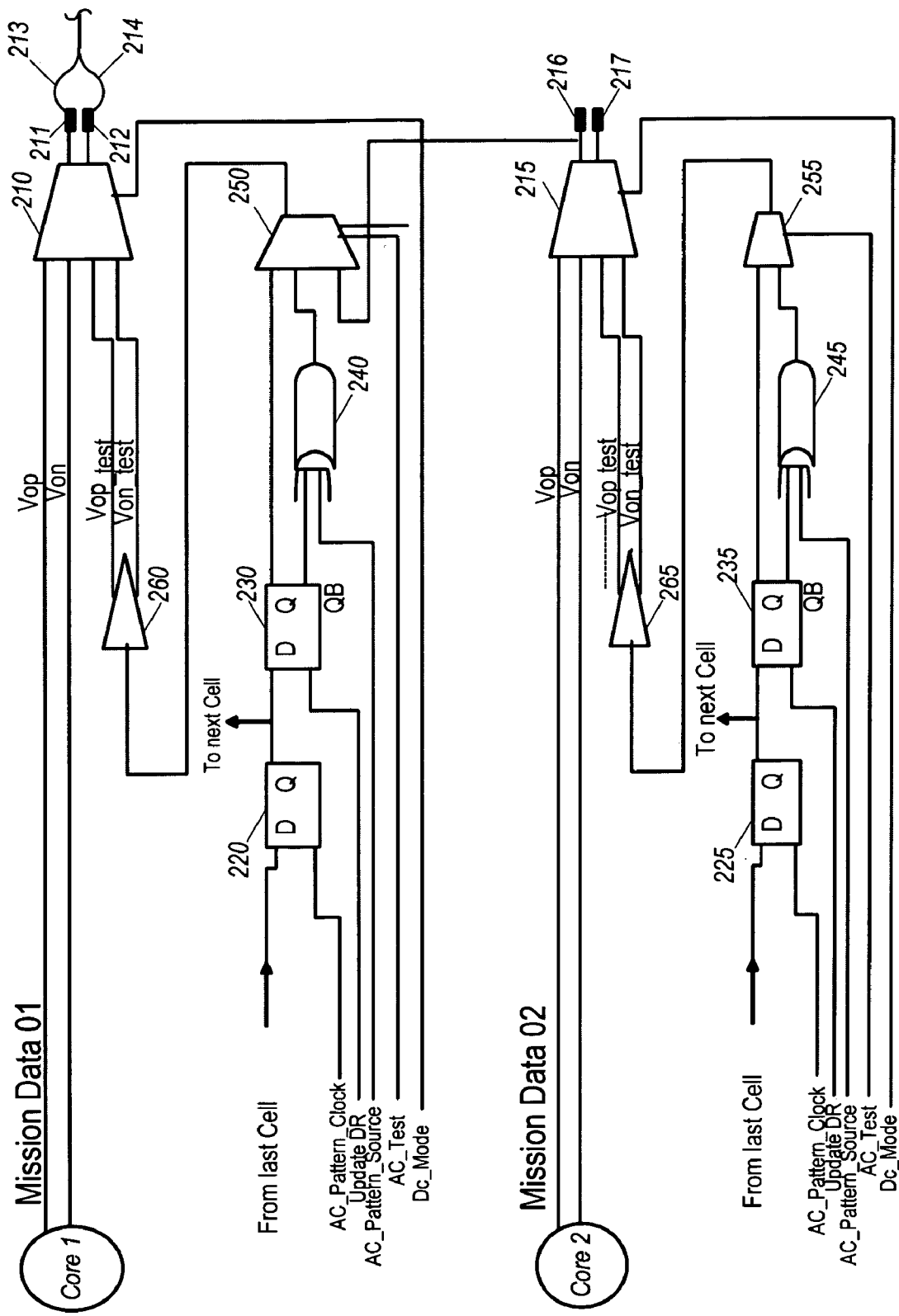
FIG. 2 is a block diagram of a pair of boundary-scan cells in accordance with one embodiment of the present invention.

Referring now to FIG. 2, shown is a block diagram of a pair of AC boundary-scan cells in accordance with one embodiment of the present invention. Generally, the first boundary-scan cell is shown at the top of FIG. 2 (i.e., components 210, 220, 230, 240, 250, and 260) and the second boundary-scan cell at the bottom of FIG. 2 (i.e., components 215, 225, 235, 245, 255, and 265). As shown at the top of FIG. 2, a portion of a core of a semiconductor device (Core 1) provides mission data (Mission Data 1) via a differential line pair. In one embodiment, the differential signals may be low-voltage differential signals (LVDS) to accommodate high speed signaling. As shown in FIG. 2, Mission Data 1 is coupled to an output multiplexer 210.

A boundary-scan cell may also include JTAG logic. In the embodiment of FIG. 2, such JTAG logic may be embodied in a capture cell 220, an update cell 230, an exclusive OR (XOR) gate 240, a JTAG multiplexer 250 and a converter 260. As shown in FIG. 2, data from a previous boundary-scan cell may be input into capture cell 220 which, in the embodiment of FIG. 2, may be a D-type flip-flop. A JTAG control signal (AC_Pattern_Clock) may be input as a clock of capture cell 220. The control signal may be provided by a TAP controller (not shown in FIG. 2), in one embodiment. The output of capture cell 220 may be coupled to update cell 230 and a next boundary-scan cell of the semiconductor device, as shown in FIG. 2.

In such manner, boundary-scan cells may be daisy chained to each other such that a first boundary-scan cell provides an output to a second boundary-scan cell, which in turn provides an input to a third boundary-scan cell, and so forth. A JTAG control signal (Update DR) may be input into a clock of update cell 230. An output of update cell 230 may be provided as an input to JTAG multiplexer 250. The Q output of signal is coupled to XOR 240, as is an AC_Pattern_Source signal, which may be a control signal from a TAP controller. The output of XOR 240 is also coupled to JTAG multiplexer 250.

As shown in FIG. 2, JTAG multiplexer 250 also receives a third input signal. This input signal is provided from an output of output multiplexer 215, which is part of the second boundary-scan cell. In such manner, data may be propagated through the second boundary-scan cell and be provided for output from output multiplexer 210 of the first boundary-scan cell. Because there are three inputs to JTAG multiplexer 250, two select signals may be provided to JTAG multiplexer 250 to adequately select the desired signal for output. These select signals may include an AC_Test signal and a second select signal. In one embodiment, both select signals may be provided via a TAP controller.

As further shown in FIG. 2, the output of JTAG multiplexer 250 may be provided to a converter 260 which may convert the single-ended signal to a differential signal. In one embodiment, converter 260 may be a complementary metal oxide semiconductor (CMOS) to current mode logic (CML) converter which provides a differential signal pair to output multiplexer 210. Based on a select signal (DC_Mode) which, in one embodiment may be from a TAP controller, output multiplexer 210 outputs either JTAG test data or mission data via output nodes 211 and 212. In one embodiment, a pair of RF probes 213 and 214 may be coupled to nodes 211 and 212 to probe AC JTAG test signals.

Also shown in FIG. 2 is a second boundary-scan cell which receives Mission Data 2 from Core 2, which may be a second portion of a mixed signal semiconductor device, in one embodiment. Mission Data 2 may be provided to output multiplexer 215. A JTAG logic portion of the second boundary-scan cell may include the same components and may operate the same as the first boundary-scan cell, discussed above. In the embodiment of FIG. 2, the second boundary-scan cell may include a capture cell 225 coupled to an update cell 235, which in turn is coupled to a JTAG multiplexer 255 and an XOR gate 245. JTAG multiplexer 255 may also be coupled to a converter 265, a differential output of which is coupled to output multiplexer 215. Output multiplexer 215 may be coupled to output nodes 216 and 217 to which RF probes may be coupled, in certain embodiments.

The operation of the second boundary cell may be in accordance with that described above for the first boundary cell, in certain embodiments. However, one of the differential outputs of output multiplexer 215 may be provided to JTAG multiplexer 250 of the first boundary cell. In such manner, no RF probes need be coupled to nodes 216 and 217, and JTAG test data from the second boundary-scan cell may be probed via nodes 211 and 212 of the first boundary-scan cell.

Figure 3:
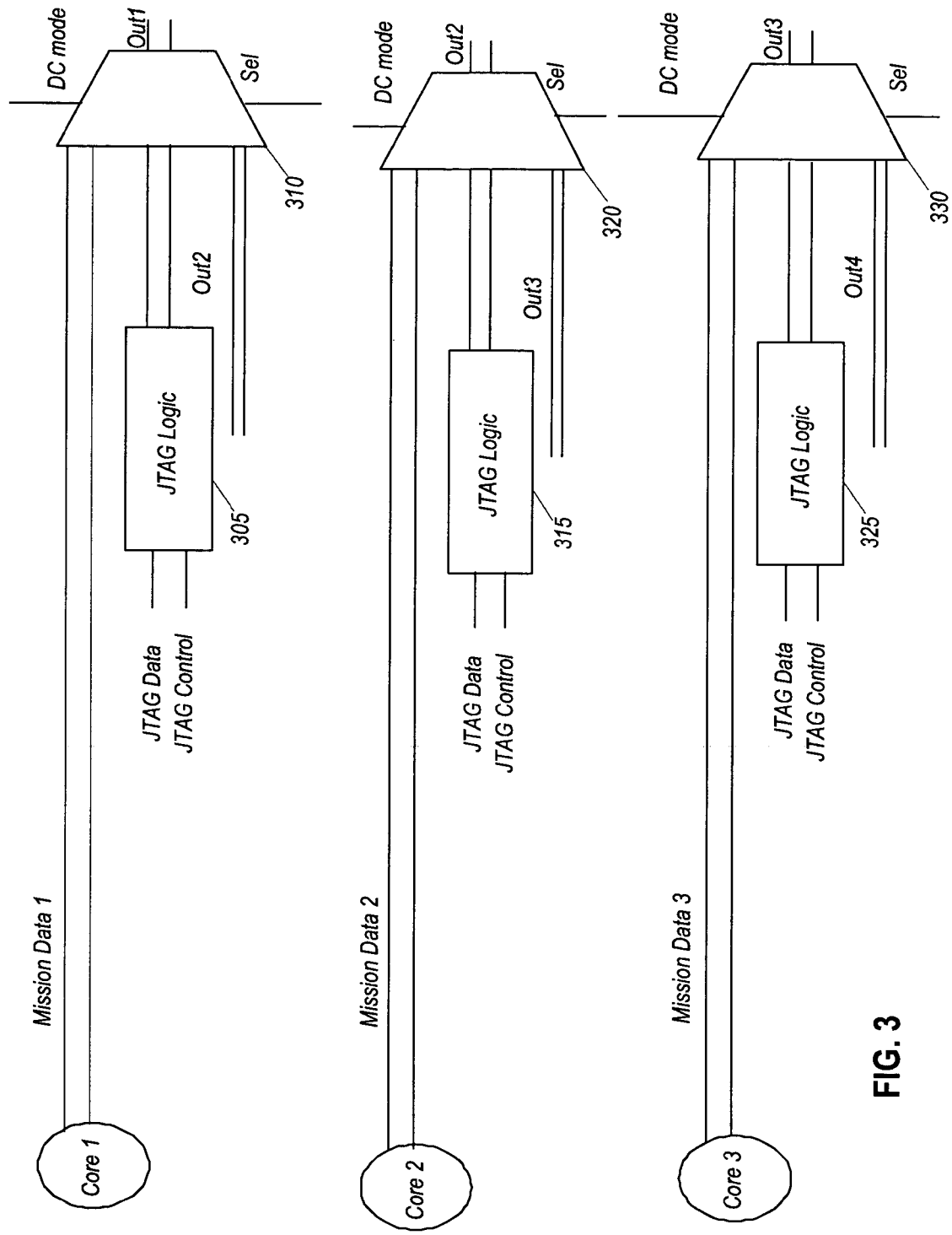
FIG. 3 is a block diagram of three boundary-scan cells in accordance with a second embodiment of the present invention.

Referring now to FIG. 3, shown is a block diagram of a device in accordance with a second embodiment of the present invention. As shown in FIG. 3, three boundary cells are shown, each having JTAG logic and an output multiplexer. Specifically, a first boundary-scan cell includes JTAG logic 305 and an output multiplexer 310. As shown in FIG. 3, Mission Data 1 from a Core 1, which may be a first portion of a mixed signal device, may be coupled to an input of output multiplexer 310.

Additionally, an output of JTAG logic 305 is coupled to an input of output multiplexer 310. JTAG data and control signals are coupled to inputs of JTAG logic 305. While shown as a generic JTAG Data signal and a generic JTAG Control signal, it is to be understood that various data and control signals may be present, as discussed above with regard to FIG. 2. In one embodiment, JTAG logic 305 may be similar to the logic and converters described above with regard to FIG. 2 (e.g., capture cell 220, update cell 230, XOR 240, JTAG multiplexer 250 and converter 260). Also coupled to an input of output multiplexer 310 is a differential signal pair (Out 2). This signal pair is an output of an output multiplexer 320, which is part of a second boundary-scan cell.

As shown in FIG. 3, the second boundary-scan cell includes JTAG logic 315 and output multiplexer 320. The second boundary-scan cell receives Mission Data 2 from a second core portion (Core 2) of the mixed signal device. Output multiplexer 320 is coupled to receive Mission Data 2, the output of JTAG logic 315, and an output of an output multiplexer 330, which is part of a third boundary-scan cell.

Still referring to FIG. 3, a third boundary-scan cell includes JTAG logic 325 and an output multiplexer 330. Output multiplexer 330 is coupled to receive Mission Data 3 from a third core portion (Core 3) of a mixed signal device, an output of JTAG logic 325 and an output of a fourth boundary-scan cell (not shown in FIG. 3).

In such manner, differential signal pairs may be re-routed from a plurality of boundary-scan cells to a single boundary-scan cell for testing via RF probes coupled to the single boundary-scan cell. In such embodiments, the output of various output multiplexers (e.g. output multiplexers 310, 320 and 330) may be selected via control signals from a TAP controller. In the embodiment shown in FIG. 3, the control signals may include a DC mode signal and a select (SEL) signal.

While shown in FIG. 3 as including three boundary-scan cells, in other embodiments more or fewer scan cells may be present. For example, in the embodiment of FIG. 3, a fourth boundary-scan cell (which is not shown) may have an output coupled to output multiplexer 330.

In other embodiments, a device having multiple channels may route test signals, such as AC JTAG signals, to more than one channel. In such manner, signal quality degradation may be limited, in certain embodiments. For example, in a device having 12 channels, a pair of RF probes may be used on three different channels. In one such embodiment, 2 RF probes may be coupled to channels 1, 6, and 12. Then test signals from channels 2, 3, and 4 may be re-routed to channel 1; test signals from channels 9, 10, and 11 may be re-routed to channel 12; and test signals from channels 5, 7, 8 may be re-routed to channel 6. In such an embodiment, a given channel's test signals may pass through, at most, four extra multiplexers. Further, any signal degradation that occurs is unequal only in test mode. In regular mode, all channels may have similar signal paths and hence similar signal degradation.

Figure 4:
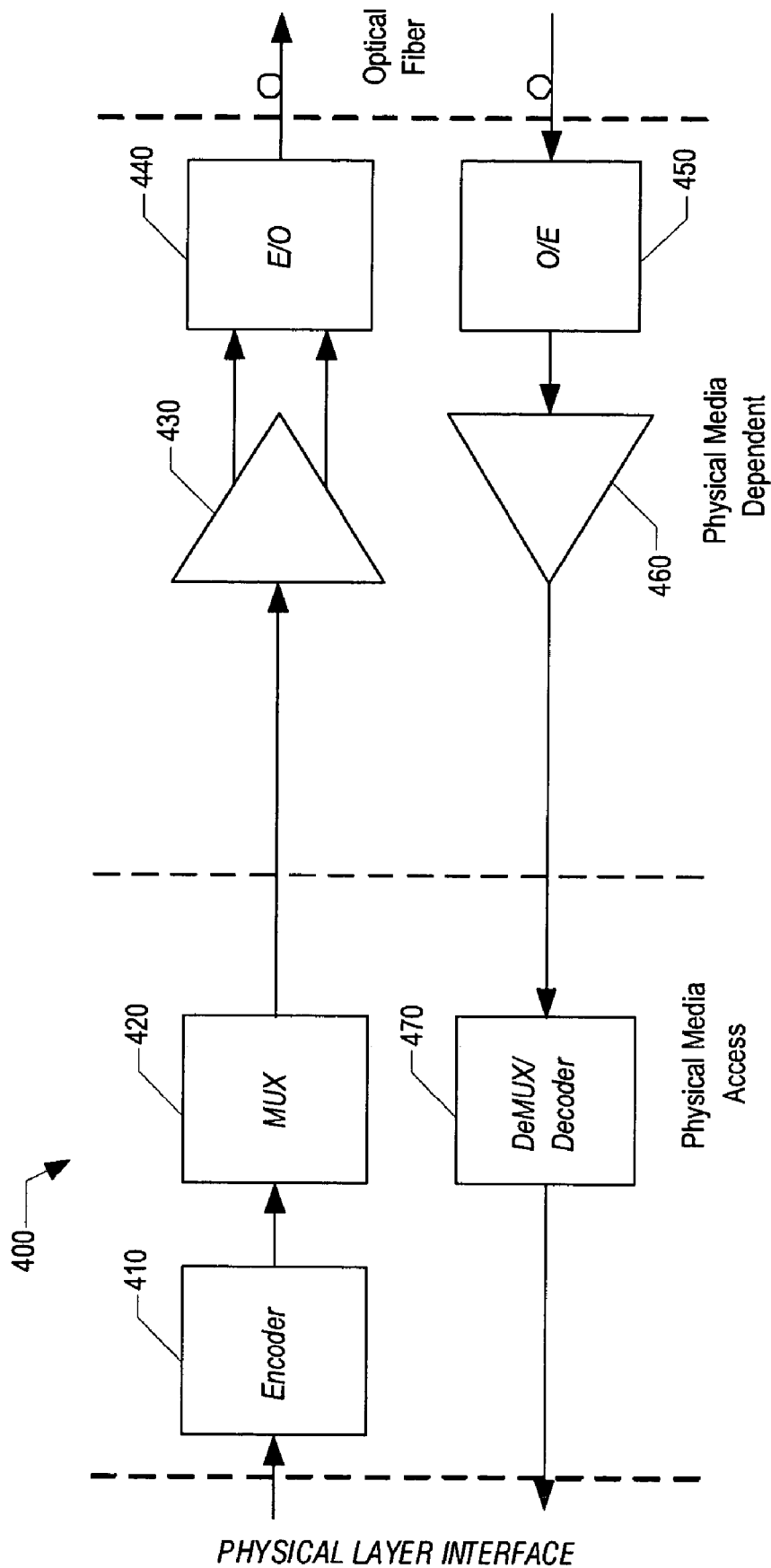
FIG. 4 is a block diagram of a system in accordance with one embodiment of the present invention.

Referring now to FIG. 4, shown is a block diagram of a system in accordance with one embodiment of the present invention. As shown in FIG. 4, system 400 may be a line card or other switching device used in, for example, a high speed optical network, such as a metro area network (MAN), a local area network (LAN), or a wide area network (WAN). As shown in FIG. 4, signals from a physical layer interface may be provided to a physical media access (PMA) section, and specifically to an encoder 410 for encoding. The encoded signals may pass through a multiplexer 420 and be provided to a physical media dependent (PMD) section and specifically to a laser driver 430 for amplification and conversion to a differential signal pair. In one embodiment, driver 430 may have AC JTAG test capabilities in accordance with an embodiment of the present invention. As shown in FIG. 4, driver 430 may be coupled an electrical to optical (E/O) converter 440 to convert electrical signals to optical signals for transmission over an optical fiber, for example, at a 10 Gigabits per second (Gbps) rate.

Also shown in system 400 is a receive path in which received optical signals may be provided to a PMD section, via an optical to electrical (O/E) converter 450 to convert optical signals to electrical signals. Such signals may then be provided to a transmittance amplifier 460 for amplification. The amplified signals may then be provided to a PMA section, and more specifically to a demultiplexer/decoder 470. Decoded signals may then be provided to the physical layer interface.

While discussed above as an optical system, it is to be understood that embodiments of the present invention may be used in connection with various mixed signal and other devices which may benefit from AC testing in accordance with an embodiment of the present invention. Further, while discussed with regard to AC JTAG testing, embodiments of the present invention may be used with other test systems.

Embodiments may be implemented in a computer program that may be stored on a storage medium having instructions to program a system to perform the embodiments. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic RAMs and static RAMs, erasable programmable read-only memories (EPROMs), electrically erasable programmable read-only memories (EEPROMs), flash memories, magnetic or optical cards, or any type of media suitable for storing electronic instructions. For example, FIG. 1 shows a storage 105 coupled to semiconductor device 100. Other embodiments may be implemented as software modules executed by a programmable control device, such as a processor or a custom-designed state machine, for example, TAP controller 170 of FIG. 1.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first test channel having a first multiplexer to receive test cell data processed in the first test channel and a test output of a second test channel;
the first test channel having a second multiplexer coupled to receive the output of the first multiplexer and first channel mission data; and
a converter coupled between the first multiplexer and the second multiplexer to convert the output of the first multiplexer to a differential signal.

2. The apparatus of claim 1, wherein the test output of the second test channel comprises alternating current test data.

3. The apparatus of claim 1, wherein the first test channel comprises a capture cell coupled to an update cell, the update cell coupled to provide the test cell data to the first multiplexer.

4. The apparatus of claim 1, further comprising a plurality of channels, each having an output multiplexer coupled to a test multiplexer of another of the plurality of channels.

5. An apparatus comprising:
a first test channel to receive first mission data from a first portion of a device, the first test channel having first test logic comprising a capture cell coupled to an update cell, the update cell coupled to provide first channel test data to a first multiplexer, the first test logic to receive test data and to provide the first channel test data to a first output node of the first test channel; and
a second test channel to receive second mission data from a second portion of the device, the second test channel having second test logic to receive test data and to provide second channel test data to the first output node.

6. The apparatus of claim 5, further comprising a test controller to select the first channel test data or the second channel test data for output on the first output node.

7. The apparatus of claim 5, further comprising a plurality of channels having a channel test output signal, each of the channel test output signals routed to the first output node.

8. The apparatus of claim 5, wherein the second channel test data is coupled to a multiplexer of the first test channel.

9. The apparatus of claim 5, wherein the first test channel comprises an alternating current test cell.

10. A system comprising:
a mixed signal device including analog circuitry and digital circuitry to interface the system to an optical network, the mixed signal device comprising a first channel having a first multiplexer to receive first channel test cell data and an output of a second channel, the first channel having a second multiplexer coupled to receive an output of the first multiplexer and first channel mission data, wherein the mixed signal device comprises a physical media dependent device to couple to an optical fiber; and
a physical layer interface coupled to the mixed signal device.

11. The system of claim 10, wherein the output of the second channel comprises alternating current test data.

12. A system comprising:
a mixed signal device including analog circuitry and digital circuitry to interface the system to an optical network, wherein the mixed signal device comprises a physical media dependent device to couple to an optical fiber, the mixed signal device comprising a first channel having a first multiplexer to receive first channel test cell data and an output of a second channel, the first channel having a second multiplexer coupled to receive an output of the first multiplexer and first channel mission data, and an electrical to optical convener coupled to the second multiplexer; and
a physical layer interface coupled to the mixed signal device.

13. The system of claim 10, wherein the mixed signal device comprises a plurality of channels, each having an output multiplexer coupled to a test multiplexer of another of the plurality of channels.

14. The apparatus of claim 5, wherein the second channel test data comprises a differential signal pair.

15. The apparatus of claim 1, wherein the second multiplexer is to receive the differential signal and the first channel mission data, wherein the first channel mission data comprises a mission differential signal.

16. The apparatus of claim 15, wherein the mission differential signal comprises a low voltage differential signal.

17. The system of claim 12, wherein the mixed signal device comprises a plurality of channels, each having an output multiplexer coupled to a test multiplexer of another of the plurality of channels.

18. The system of claim 12, wherein the output of the second channel comprises alternating current test data.

* * * * *